US012767170B2

(12) United States Patent
Tagesson et al.

(10) Patent No.: US 12,767,170 B2
(45) Date of Patent: Oct. 20, 2026

(54) VEHICLE CONTROL FOR SIMPLIFIED AUTONOMOUS DRIVE

(71) Applicant: VOLVO TRUCK CORPORATION, Gothenburg (SE)

(72) Inventors: Kristoffer Tagesson, Hammarö (SE); Jan-Inge Svensson, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 207 days.

(21) Appl. No.: 18/684,244

(22) PCT Filed: Aug. 31, 2021

(86) PCT No.: PCT/EP2021/074061
§ 371 (c)(1),
(2) Date: Feb. 16, 2024

(87) PCT Pub. No.: WO2023/030615
PCT Pub. Date: Mar. 9, 2023

(65) Prior Publication Data

US 2024/0359706 A1 Oct. 31, 2024

(51) Int. Cl.
*G01C 22/00* (2006.01)
*B60W 10/18* (2012.01)
(Continued)

(52) U.S. Cl.
CPC .......... *B60W 60/001* (2020.02); *B60W 10/18* (2013.01); *B60W 40/00* (2013.01);
(Continued)

(58) Field of Classification Search
CPC .... B60W 60/001; B60W 10/18; B60W 40/00; B60W 2552/20; B60W 2530/201;
(Continued)

(56) References Cited

U.S. PATENT DOCUMENTS 9,229,453 B1 1/2016 Lee
9,731,755 B1 8/2017 Moshchuk et al.
(Continued)

FOREIGN PATENT DOCUMENTS

DE 102014208786 A1 11/2015
EP 1775188 A1 4/2007
(Continued)

OTHER PUBLICATIONS

International Search Report and Written Opinion of the International Searching Authority in corresponding International Application No. PCT/EP2021/074061 mailed May 23, 2022 (13 pages).
(Continued)

*Primary Examiner* — Adam M Alharbi
(74) *Attorney, Agent, or Firm* — Jeffri A. Kaminski; Venable LLP

(57) ABSTRACT

A control system for autonomous drive of a heavy-duty vehicle, comprising an autonomous drive, AD, controller configured with a trajectory tracking function arranged to track a desired vehicle trajectory is provided. A first vehicle model models a response by the vehicle to a requested steering angle. The AD controller generates a steering angle request based on the desired vehicle trajectory and on the first vehicle model. The control system includes a vehicle motion management, VMM, function arranged to receive the steering angle request from the AD controller, where the VMM function comprises a second vehicle model configured to be aligned with the first vehicle model, where the VMM function is arranged to obtain a desired vehicle behavior based on a response of the second vehicle model to the steering angle request, where the VMM function is arranged to determine motion support device control set points in dependence of the desired vehicle behavior.

21 Claims, 5 Drawing Sheets

(51) Int. Cl.

| | |
|---|---|
| ***B60W 40/00*** | (2006.01) |
| ***B60W 60/00*** | (2020.01) |
| ***G06F 30/15*** | (2020.01) |

(52) U.S. Cl.

CPC ......... *G06F 30/15* (2020.01); *B60W 2510/20* (2013.01); *B60W 2510/22* (2013.01); *B60W 2520/10* (2013.01); *B60W 2520/105* (2013.01); *B60W 2520/12* (2013.01); *B60W 2520/125* (2013.01); *B60W 2520/14* (2013.01); *B60W 2530/10* (2013.01); *B60W 2530/20* (2013.01); *B60W 2530/201* (2020.02); *B60W 2552/20* (2020.02)

(58) Field of Classification Search

CPC ......... B60W 2510/20; B60W 2510/22; B60W 2520/10; B60W 2520/105; B60W 2520/12; B60W 2520/125; B60W 2520/14; B60W 2530/10; B60W 2530/20; G06F 30/15

See application file for complete search history.

(56) References Cited

U.S. PATENT DOCUMENTS

| | | | | |
|---|---|---|---|---|
| 10,407,035 | B1 | 9/2019 | Gadda et al. | |
| 2010/0228420 | A1 | 9/2010 | Lee | |
| 2017/0233001 | A1 | 8/2017 | Moshchuk et al. | |
| 2019/0126711 | A1 | 5/2019 | Giovanardi et al. | |
| 2020/0142405 | A1* | 5/2020 | Havens | G05D 1/0088 |
| 2020/0189591 | A1 | 6/2020 | Mellinger, III et al. | |
| 2020/0356849 | A1 | 11/2020 | Xu et al. | |
| 2021/0291862 | A1* | 9/2021 | Jiang | B60W 60/0017 |
| 2021/0403081 | A1* | 12/2021 | Funke | B62D 6/001 |
| 2023/0035526 | A1* | 2/2023 | Okuda | G08G 1/096725 |

FOREIGN PATENT DOCUMENTS

| | | | |
|---|---|---|---|
| GB | 2568548 | A | 5/2019 |
| WO | 2021063787 | A1 | 4/2021 |
| WO | 2021079338 | A1 | 4/2021 |

OTHER PUBLICATIONS

International Preliminary Report on Patentability in corresponding International Application No. PCT/EP2021/074061 mailed Apr. 5, 2023 (6 pages).

R.C. Coulter; “Implementation of the Pure Pursuit Path Tracking Algorithm”; Carnegie-Mellon University, Pittsburgh, PA; Robotics INST, 1992 (10 pages).

T J Gordon et al; “An Automated Driver based on Convergent Vector Fields”, Proc. Inst. Mech. Eng. Part D, vol. 216, pp. 329-347 (20 pages), 2002.

Hans B. Pacejka; “Tyre and Vehicle Dynamics”; Second Edition; Elsevier Ltd. 2012, ISBN 978-0-08-097016-5, Hans Pacejka covers the fundamentals of tyre models; 657 pages.

Holly E.B. Russell et al; “Design of Variable Vehicle Handling Characteristics Using Four-Wheel Steer-by-Wire”; IEEE Transactions on Control Systems Technology, vol. 24, No. 5, Sep. 2016; pp. 1529-1540 (12 pages).

Kristoffer Tagesson; “Driver-centered Motion Control of Heavy Trucks”; Thesis for the Degree of Doctor of Philosophy in Machine and Vehicle Systems; Department of Applied Mechanics Chalmers University of Technology; Göteborg, Sweden, 2017; 110 pages.

* cited by examiner

VEHICLE CONTROL FOR SIMPLIFIED AUTONOMOUS DRIVE

CROSS-REFERENCE TO RELATED APPLICATIONS

This application is a U.S. National Stage application of PCT/EP2021/074061, filed Aug. 31, 2021 and published on Mar. 9, 2023 as WO 2023/030615, all of which is hereby incorporated by reference in its entirety.

TECHNICAL FIELD

The present disclosure relates to vehicle motion management for autonomous or semi-autonomous heavy-duty vehicles, i.e., coordinated control of motion support devices such as service brakes, propulsion devices and power steering. Although the invention is not restricted to a particular type of vehicle, it can be applied with advantage in autonomously operated heavy-duty vehicles such as trucks, buses, and in construction machines.

BACKGROUND

A heavy-duty articulated vehicle is a complex and dynamic mechanical system that is difficult to model accurately and that may quickly change behavior in response to e.g., change in road friction conditions, where non-linearities are common. For instance, the steering system of a heavy-duty vehicle is affected both by internal error sources arising from the vehicle itself, such as differences in axle loads, and also by external error sources such as wind and road banking. In "Driver-centered Motion Control of Heavy Trucks", Chalmers University of Technology, PhD thesis 2017, Tagesson discusses the mechanics of modern steering arrangements for heavy-duty vehicles, as well as some of the error sources associated with steering a heavy-duty vehicle.

At the same time, vehicles are becoming ever more complex in terms of mechanics, pneumatics, hydraulics, electronics, and software. A modern heavy-duty vehicle may comprise a wide range of different controllable physical devices, such as combustion engines, electric machines, friction brakes, regenerative brakes, shock absorbers, air bellows, and power steering devices. These physical devices are commonly known as Motion Support Devices (MSDs). The MSDs may be individually controllable, for instance such that friction brakes may be applied at one wheel, i.e., a negative torque, while another wheel on the vehicle, perhaps even on the same wheel axle, is simultaneously used to generate a positive torque by means of an electric machine.

This makes it challenging to design systems and algorithms for autonomous drive (AD), since a control command generated by the AD controller may result in widely different vehicle behavior depending on vehicle type and overall driving conditions. A further challenge lies in verifying the function of an AD control system, due to the inherent complexity in controlling an articulated heavy-duty vehicle.

US2020189591 discloses a steering angle control unit for a vehicle, arranged to receive a steering angle request from a higher layer control unit. A motion planning and control system computes a steering angle and issues a command to a lower-level control system. A vehicle model is used for determining a steering wheel angle limit which in turn determines if the steering angle request can be accommodated.

US2017233001 and US2019126711 both describe use of a bicycle model to optimize steering actuator controls.

Despite the advancements made to date, there is a need for improved systems for vehicle control that simplify design of algorithms for autonomous drive.

SUMMARY

It is an object of the present disclosure to provide control units and methods which facilitate autonomous vehicle control in a safe, efficient, and robust manner.

This object is at least in part obtained by a control system for autonomous drive (AD) of a heavy-duty vehicle. The control system comprises an AD controller configured with a trajectory tracking function arranged to track a desired vehicle trajectory, and a first vehicle model arranged to model a response by the vehicle to a requested steering angle, where the AD controller is arranged to generate a steering angle request based on the vehicle model and on a desired trajectory by the vehicle. The control system also comprises a vehicle motion management (VMM) function arranged to receive the steering angle request from the AD controller. The VMM function comprises a second vehicle model aligned with the first vehicle model. The VMM function is arranged to generate a desired vehicle behavior based on a response of the second vehicle model to the steering angle request. The VMM function is furthermore arranged to determine a motion support device control allocation, i.e., a collection of MSD set points, in dependence of the desired vehicle behavior.

This way the response which the AD controller expects from the vehicle when issuing the steering angle request is also obtained from the vehicle in practice, despite the often-complex vehicle factors and environment dependent factors such as induced steering angle errors and effects from road banking. It is an advantage that the AD controller can rely at least to some degree on the first vehicle model to accurately model the actual vehicle response to steering inputs. This is made possible since the VMM function performs MSD control allocation to generate a behavior by the vehicle which is in line with that which is expected by the AD controller, regardless of vehicle type and compensating for at least some external factors. In other words, the AD controller may generate control commands according to its model of the vehicle and be confident that the vehicle will respond to the control commands in the expected manner. The VMM function will make adjustments in the MSD control allocation to compensate for disturbances, such that the vehicle behaves as the AD controller expects. This way the AD controller will experience a more homogenous vehicle behavior over a wider range of different driving scenarios.

The trajectory tracking function may be arranged to track the desired vehicle trajectory by optimization of a cost function which is at least partly based on an output of the first vehicle model. This means that the AD controller uses the first vehicle model when performing trajectory tracking. For instance, the AD controller may plan a time sequence of steering wheel angles and an acceleration profile while, according to the first vehicle model, will cause the vehicle to follow a desired trajectory. The first vehicle model may also be indicative of, e.g., yaw and wheel slip, and can therefore also be used to follow a trajectory under constraints of keeping these under respective acceptable thresholds. In this way, the trajectory tracking function can be arranged to determine the steering angle request based on the first vehicle model. The steering angle request optionally corresponds to one or more virtual road wheel angles. A virtual road wheel angle is a road wheel angle which causes some curvature by the vehicle. However, the virtual road wheel angle need not necessarily correspond to any physical road wheel angle. Rather, as will be understood from the following more detailed explanation, a virtual road wheel angle may also be generated by differential braking or other forms of MSD coordination solution.

According to aspects, the first vehicle model is a static vehicle model, such as a yaw gain model of the heavy-duty vehicle or a dynamic vehicle model, such as a linear one-track model of the heavy-duty vehicle. It is an advantage that different vehicle models can be used in the proposed concept since it allows a design freedom and leaves room for application specific optimization. The first vehicle model may for instance be configured to output an expected state of a towing vehicle unit of the heavy-duty vehicle in dependence of an applied steering wheel angle, where the expected state comprises any of a lateral position of the towing unit, a lateral deviation from a desired trajectory of a point of the towing unit, a yaw rate, a lateral acceleration, a lateral velocity, a longitudinal position, a longitudinal acceleration, and a longitudinal velocity of the towing vehicle unit. The first vehicle model may optionally also be configured to output an expected state of a towed vehicle unit of the heavy-duty vehicle in dependence of an applied steering wheel angle, where the expected state comprises any of an articulation angle of the towed unit, a lateral position of the towed unit, a lateral deviation from a desired trajectory of a point of the towed unit, a yaw rate, a lateral acceleration, a lateral velocity, a longitudinal position, a longitudinal acceleration, and a longitudinal velocity of the towed vehicle unit.

According to an example, the steering angle request is a vector of steering angles for one or more steered virtual axles. A virtual axle need not necessarily correspond exactly to a physical axle. Rather, a virtual axle may be used in the model to represent a plurality of lumped axles, or an axle in a different location on the vehicle. By introducing virtual axles, an increased computational efficiency can be achieved. Also, the dimensionality of the various vehicle models can be reduced, which is an advantage.

According to aspects, the desired vehicle behavior is represented by any of a lateral position of a point on a vehicle unit of the heavy-duty vehicle, a yaw rate of a vehicle unit, a lateral acceleration of a vehicle unit, a lateral velocity of a vehicle unit, and a body sideslip of a vehicle unit. It is an advantage that not only lateral position is considered, since then trajectory following can be optimized to also result in desired values of, e.g., yaw rate. This improves safety and also passenger (and driver) comfort, which is an advantage. By considering body sideslip, the risk of ending up in a non-linear vehicle state which is difficult to predict and maneuver away from, can be reduced.

According to aspects, the second vehicle model is configured to be aligned with the first vehicle model by exchange of a pre-determined number of model parameter values. These model parameters will be discussed in more detail below. The first and second vehicle models may be aligned as part of an initial calibration procedure, and/or more continuously as the driving scenarios unfold. A model parameter value may, e.g., correspond to any of a vehicle unit mass, a vehicle unit yaw inertia, a tyre stiffness, a road friction level, a vehicle longitudinal velocity, an axle load, a vehicle unit wheelbase, a vehicle unit coupling position, and a vehicle type. Thus, for instance, if the vehicle is unloaded or loaded at some point along the transportation mission, the two models will be re-aligned so as to agree with each other once more. The second vehicle model may, e.g., be configured to be aligned with the first vehicle model by having one or more corresponding or identical model states. Model design is, generally, a well-studied topic in the literature, and will therefore not be discussed at length herein.

According to aspects, the second vehicle model a static vehicle model, such as a yaw gain model or a dynamic vehicle model, such as a linear one-track model.

According to aspects, the VMM function is configured to determine a steering offset value, and to determine the motion support device control set points in dependence of the steering offset value. A steering offset value may, e.g., be used to indicate a time varying bias between power steering set point and actual steering angle. This offset can be dependent on both aspects related to the vehicle itself, and also aspects related to the surrounding vehicle environment.

A third vehicle model may also be configured for determining the motion support device control allocation set points based on the desired vehicle behavior. Thus, given a desired vehicle behavior, the third vehicle model can be used to break down the desired behavior into a set of MSD set points which is predicted by the third vehicle model to result in the desired behavior. Notably, there are often more than one set point configuration which provides the desired vehicle behavior. In this case other optimization parameters can be considered in selecting the MSD set point to use. For instance, tyre wear can be considered when selecting between different possible vehicle MSD control allocations.

The third vehicle model may, for instance, comprise any of an estimate of vehicle motion caused by side wind, an estimate of vehicle motion caused by road banking, an estimate of vehicle motion caused by axle misalignment, an estimate of vehicle motion caused by a difference in tyre radius, a model of compliance in a steering system of the heavy-duty vehicle, and a model of suspension travel effect on a steering system of the heavy-duty vehicle.

According to aspects, the control system is arranged to compare a current vehicle state of the heavy-duty vehicle to a threshold limit set in dependence of the desired vehicle behavior, and to trigger an action if the threshold is breached. This may be used as a safety function, or to account for other unexpected events. The control system may, e.g., arranged to brake the vehicle if the threshold limit is passed, by modification of the motion support device control allocation set points. The action may furthermore comprise generation of a fault condition signal sent to the AD controller.

There is also disclosed herein methods, computer programs, computer readable media, computer program products, and vehicles associated with the above discussed advantages.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

With reference to the appended drawings, below follows a more detailed description of embodiments of the invention cited as examples. In the drawings.

DETAILED DESCRIPTION OF EXAMPLE EMBODIMENTS OF THE INVENTION

Figure 1:
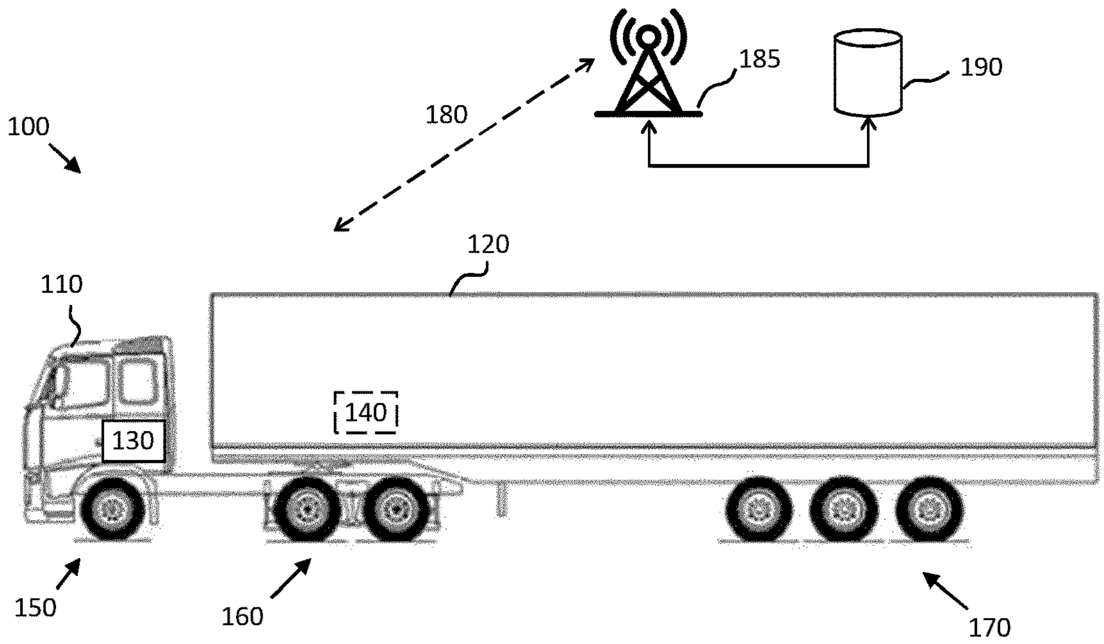
FIG. 1 shows an example heavy-duty vehicle.

The invention will now be described more fully hereinafter with reference to the accompanying drawings, in which certain aspects of the invention are shown. This invention may, however, be embodied in many different forms and should not be construed as limited to the embodiments and aspects set forth herein; rather, these embodiments are provided by way of example so that this disclosure will be thorough and complete, and will fully convey the scope of the invention to those skilled in the art. Like numbers refer to like elements throughout the description.

It is to be understood that the present invention is not limited to the embodiments described herein and illustrated in the drawings; rather, the skilled person will recognize that many changes and modifications may be made within the scope of the appended claims.

FIG. 1 illustrates an example vehicle 100 for cargo transport where the herein disclosed techniques can be applied with advantage. The vehicle 100 comprises a tractor or towing vehicle 110 supported on front wheels 150 and rear wheels 160, at least some of which are driven wheels and at least some of which are steered wheels. Normally but not necessarily, all the wheels on the tractor are braked wheels. The tractor 110 is configured to tow a first trailer unit 120 supported on trailer wheels 170 by a fifth wheel connection in a known manner. The trailer wheels are normally braked wheels but may also comprise driven wheels on one or more axles. Some trailers also comprise steered wheels in order to improve maneuverability.

It is appreciated that the herein disclosed methods and control units can be applied with advantage also in other types of heavy-duty vehicles, such as trucks with drawbar connections, construction equipment, buses, and the like. The vehicle 100 may also comprise more than two vehicle units, i.e., a dolly vehicle unit may be used to tow more than one trailer. The vehicle combination of vehicle units may of course comprise more than one steered axle.

The tractor 110 comprises a vehicle control unit (VCU) 130 for controlling various kinds of functionality, i.a., to achieve propulsion, braking, and steering. Some trailer units 120 also comprise a VCU 140 for controlling various functions of the trailer, such as braking of trailer wheels, and sometimes also trailer wheel propulsion and steering. The VCUs 130, 140 may be centralized or distributed over several processing circuits, often referred to as electronic control units (ECU). Parts of the vehicle control functions may also be executed remotely, e.g., on a remote server 190 connected to the vehicle 100 via wireless link 180 and a wireless access network 185.

Figure 2:
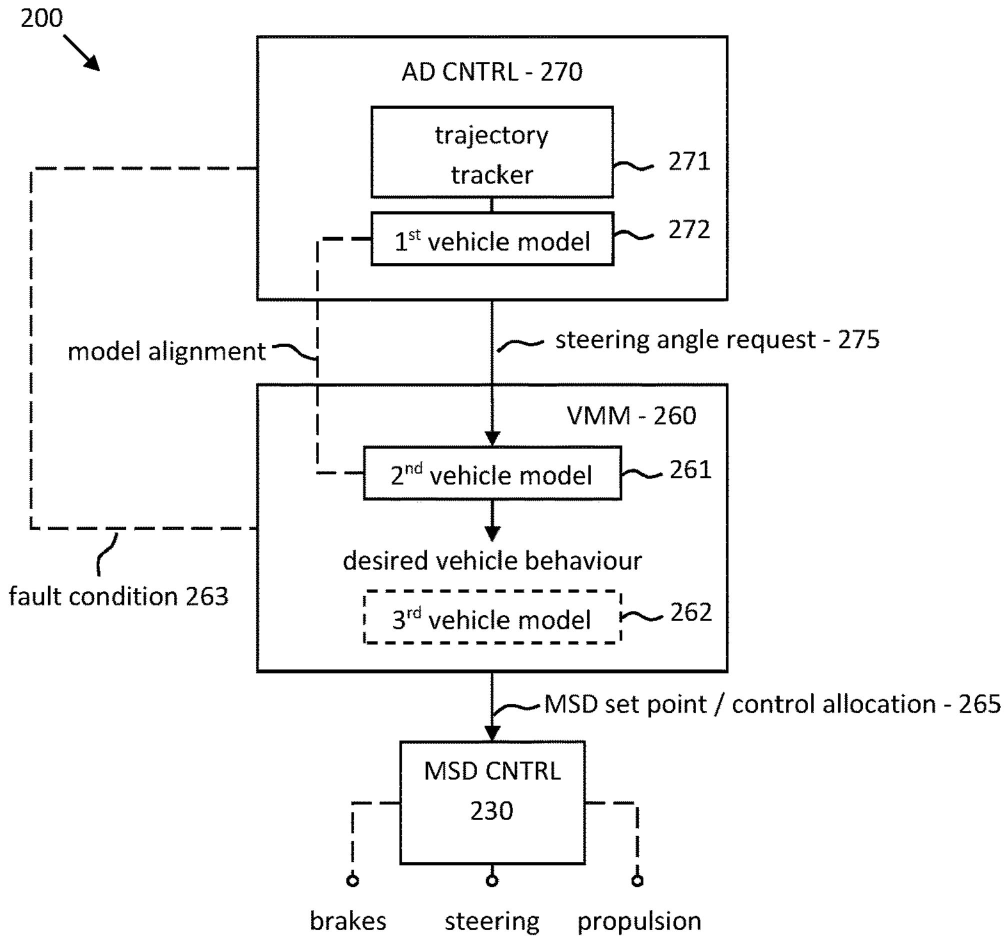
FIG. 2 schematically illustrates a heavy-duty vehicle control system.

With reference to FIG. 2, the VCU 130 on the tractor 110 (and possibly also the VCU 140 on the trailer 120 and/or the remote server 190) may be configured to execute vehicle control methods which are organized according to a layered functional architecture for autonomous drive (AD) or at least semi-autonomous control of the vehicle 100, i.e., advanced driver assistance systems (ADAS). Some functions may be comprised in a higher layer AD control function 270 and some other functionality may be comprised in a vehicle motion management (VMM) domain 260 residing in a lower functional layer. A VMM function optionally also handles vehicle power management, in which case the function may be referred to as a vehicle motion and power management (VMPM) function, although this part of the functionality will not be discussed in more detail herein. The VMM function will be discussed in more detail below in connection to FIG. 5. VMM functionality may also be referred to in the literature as integrated chassis control.

The AD controller 270 performs functions such as trajectory planning and trajectory tracking 271. Advanced driver assistance systems (ADAS) and methods for controlling autonomous drive (AD) by autonomous vehicles normally base vehicle control on some form of path following algorithm. The control system 200 first determines a desired path to be followed by the vehicle, e.g., based on a current transport mission, together with map data indicating possible routes to take in order to navigate the vehicle from one location to another. Path following is the process concerned with how to determine vehicle speed and steering at each instant of time for the vehicle to adhere to a certain target path to be followed. There are many different types of path following algorithms available in the literature, each associated with its respective advantages and disadvantages.

Pure pursuit is a well-known path following algorithm which can be implemented with relatively low complexity, it is described, e.g., in "Implementation of the pure pursuit path tracking algorithm", by R.C. Coulter, Camegie-Mellon University, Pittsburgh PA Robotics INST, 1992. The algorithm computes a set of vehicle controls, comprising steering angle, by which the vehicle moves from its current position towards a point at a predetermined "preview" distance away along the path to be followed. The pure pursuit methods cause the vehicle to "chase" a point along the path separated from the vehicle by the preview distance, hence the name.

Vector field guidance is another path following algorithm which instead bases the vehicle control on a vector field, which vector field is also determined based on a preview distance or look-a-head parameter. Vector field guidance methods were, e.g., discussed by Gordon, Best and Dixon in "An Automated Driver Based on Convergent Vector Fields", Proc. Inst. Mech. Eng. Part D, vol. 216, pp 329-347, 2002.

Figure 6:
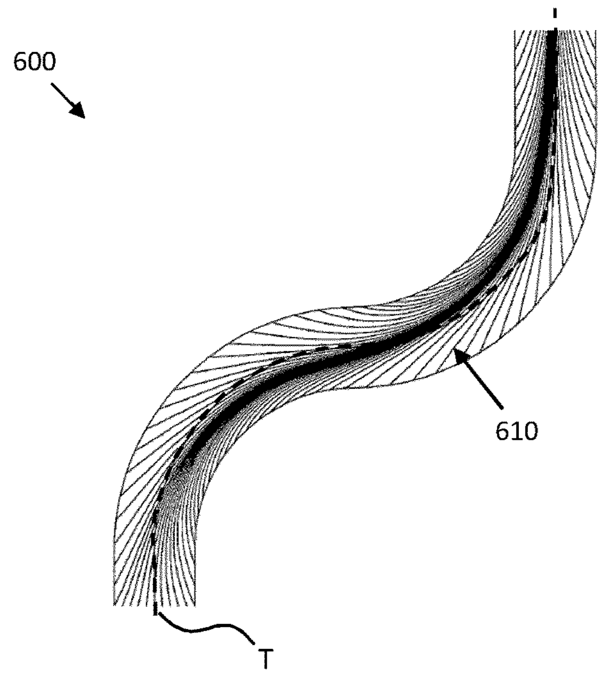
FIG. 6 schematically illustrates a trajectory tracking process.

FIG. 6 illustrates an example of a vector field guidance trajectory tracking process 600. A desired vehicle trajectory T, shown as a dashed line, first makes a tum to the right, followed by a turn to the left. The vector field associated with this desired vehicle trajectory is indicated by reference numeral 610. A control system 130, 140 for autonomous drive of a heavy-duty vehicle 100 can be arranged to make the vehicle 100 adhere to the desired vehicle trajectory T without jeopardizing vehicle safety, by adjusting the steering and the propulsion of the vehicle.

The steering angle of a heavy-duty vehicle steering system may be measured inside the electronic power steering motor and/or by a separate steering angle sensor. When considering the dynamics of the vehicle it is, however, usually the angle of the wheels with respect to the road that is of importance. The angle of the motor and that of the wheels may have a rather complex relation, since the steering system is subject to effects from compliance, backlash, and so on. External forces may also act on the wheel and cause a disturbance to the steering angle, i.e., a discrepancy between a steering angle request and an applied steering wheel angle.

Consequently, a problem in these types of path following systems is that the physical behavior of the vehicle 100 will differ in dependence of many factors, such as side wind, road banking, and also the characteristics of the vehicle, such as if the vehicle has worn tyres, is heavily loaded, and so on. This greatly complicates higher layer vehicle control, since the response by the vehicle to a given steering angle request can differ relatively much between vehicles and also from one driving scenarios to another.

A purpose of the herein disclosed techniques is to remove some of this uncertainty, and thereby simplify the design of the higher layer functions. This is achieved by the VMM function 260, which receives the steering angle request from the AD controller 270, and then controls the different MSDs (brakes, steering, propulsion, etc.) on the vehicle 100 such that the vehicle will behave as expected by the AD controller, regardless of the above-mentioned factors that influence the response by the vehicle to the control commands. This way, the response by the vehicle to a given steering request will be more consistent, since the VMM function 260 absorbs many of the variations in behavior. Thus, a five-degree steering request from the AD controller may result in a power steering system set-point of say three degrees in one case and eight degrees in another case to generate a consistent vehicle behavior.

Generally, the MSDs on the vehicle are controllable by configuring respective MSD set points, which may or not be vector valued. For instance, a propulsion device may be configurable by a torque request and a wheel slip limit, or a wheel slip request with a torque limit, or some other format. An MSD control allocation may be seen as a group of MSD set point configurations intended to generate a desired behavior by the vehicle.

During both trajectory planning and trajectory tracking, it is helpful to be able to reliably predict the response of the vehicle to a given control input, such as an applied steering wheel angle, in order to follow a desired vehicle trajectory more closely. Herein, if nothing else is explicitly stated, a steering angle is defined as an average road to wheel angle of a steered axle, i.e., accounting for road wheel angle differences of the two steered wheels of a steered axle due to Ackermann geometries and the like. It is furthermore appreciated that wheels may be individually steerable in some vehicle designs, i.e., the two wheels of a steered axle may be possible to steer independently of each other and may also comprise independently actuated wheel-end electric motors. Towards this end, the AD controller 270 comprises a first vehicle model 272, which models vehicle behavior in response to a given set of input commands, such as a requested steering angle. The first vehicle model may be a static vehicle model or a more advanced dynamic vehicle model. Generally, a vehicle model is classified as dynamic if its behavior at a given instant depends not only on the present inputs but also on the past inputs. A dynamic model is said to have memory or inertia. A dynamic system is most often described by one or several differential equations, one or several difference equations, one or several algebraic equations with a time lag. In a static vehicle model, the state and the output at a given instant depends only on the input at this instant. The relation between the input and the output is then given by one or several algebraic equations.

With continued reference to FIG. 2, the trajectory function 271 aided by the vehicle model 272 generates a steering angle request 275, or, equivalently, a request for a given curvature, which request is sent to the VMM function 260. The VMM function also comprises a vehicle model 261, which has been aligned with the vehicle model 272 used by the AD controller 270. This vehicle model 261 allows the VMM function to determine a desired vehicle behavior, i.e., how the AD controller expects the vehicle to behave in response to the steering angle request 275. To align the different models, the two models may be arranged to perform a handshake procedure where they exchange and negotiate model parameters related to the vehicle, and potentially also a vehicle state space. For instance, the VMM function 260 may be in possession of vehicle data such as gross cargo weight and other dynamic properties of the vehicle 100, which it then shares with the first vehicle model 272 in order to align the two models with each other. This alignment can be performed as the vehicle is powered up and can also be periodically updated. For instance, the VMM function 260 may continuously update the first vehicle model on vehicle data such as estimated tyre wear, the state of the suspension of the vehicle, and the different capabilities of the motion support devices on the vehicle.

The second vehicle model 261 may be a static vehicle model, such as a yaw gain model or a dynamic vehicle model, such as a linear one-track model. The static vehicle model is of course less complex to implement compared to the dynamic vehicle model, although the dynamic vehicle model often provides improved accuracy in predicting vehicle behavior. Both static and dynamic vehicle models are previously known and will therefore not be discussed in more detail herein.

Thus, according to some aspects, the second vehicle model 261 is configured to be aligned with the first vehicle model 272 by exchange of a pre-determined number of model parameter values. The model parameter values may correspond to any of a vehicle unit mass, a vehicle unit yaw inertia, a tyre stiffness, a road friction level, a vehicle longitudinal velocity, an axle load, a vehicle unit wheelbase, a vehicle unit coupling position, and a vehicle type. The second vehicle model 261 is optionally also configured to be aligned with the first vehicle model 272 by having one or more corresponding or identical states.

According to aspects, the VMM function 260 may implement a local copy of the first vehicle model 272 used by the AD controller 270. The VMM function is then able to compare the predicted vehicle behavior for a given set of input control commands (such as a steering angle request) to the actual vehicle behavior obtained as a result of processing the steering angle request. The VMM function 260 may then transmit correction factors to the AD controller, allowing it to calibrate its first vehicle model against the actual response by the vehicle to the input control commands. This will further reduce the difference between the vehicle response to some control input expected by the AD controller, and the response to the control input obtained from the vehicle.

Figure 7:
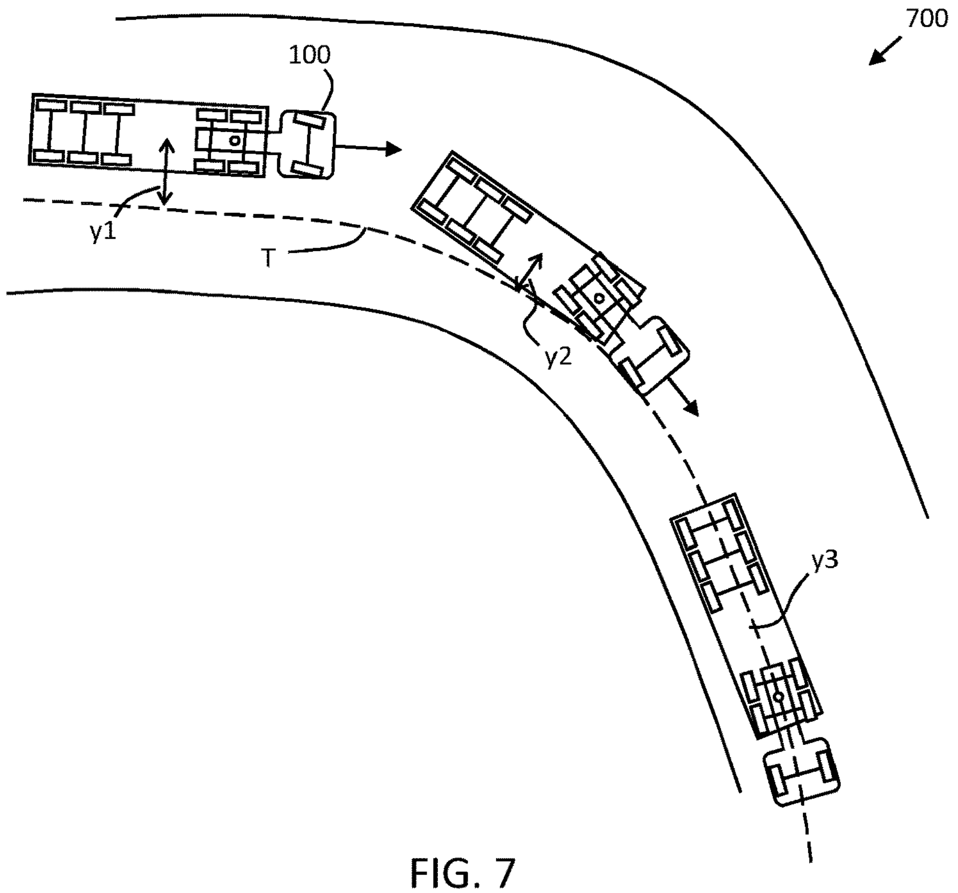
FIG. 7 shows a vehicle following a desired trajectory.

FIG. 7 shows an example of the proposed system operating in an example scenario involving a cornering maneuver by the vehicle 100. The vehicle 100 initially has a lateral deviation y1 from the desired trajectory T, for instance due to a strong gust of wind, or an unexpected strong road banking. The trajectory tracker 271 compensates for this lateral offset by generating a steering angle request which, according to the first vehicle model 272, will generate a motion by the vehicle to reduce the lateral offset in a controlled manner, e.g., without generating too much yaw motion. The steering angle request is forwarded to the VMM function 260, which generates a set of MSD control set-points, comprising steering actuator control and perhaps also propulsion control and other forms of MSD controls, which generate a vehicle behavior corresponding to that predicted by the first vehicle model 272. Consequently, the vehicle 100 behaves as expected, and the vehicle follows the desired trajectory T in a controlled manner.

The VMM function 260 performs MSD coordination, which at the very least comprises determining an applied steering angle which will result in a vehicle behavior close to the desired vehicle behavior. Note that the actual applied steering angle will likely differ from the steering angle request, since the applied steering angle will be configured to compensate for steering errors, e.g., the type of induced steering angle errors discussed in Chapter II of "Driver-centered Motion Control of Heavy Trucks", Chalmers University of Technology, Tagesson, PhD thesis, 2017. For instance, relay linkages within the steering system are likely to move as the suspension of the vehicle travels up and down or rolls. This will induce a wheel steer angle, disconnected from steering wheel movement. Also, other axles than the steered one can be sensitive to suspension travel. This effect is most apparent when the vehicle 100 hits a bump in the road or when adjusting the ride height (which can happen when shifting load if the suspension is not adjusted). In addition to the induced steering errors, there are also two other factors which merit mentioning in this context. A banked road will cause the vehicle to roll, which as explained in the previous section will induce a steering error (the wheel will turn). Yet, the understeer nature of most heavy-duty vehicles will also cause it to turn, even though the wheels are not turning. This effect can be substantial on a semi-trailer truck, such as that shown in FIG. 1. Normally around 1 degree (wheel angle) of steering compensation is required as banking varies to remove this effect. Side wind is another factor that can be accounted for in order to improve steering precision. The impact of side wind can be substantial on a truck with a long trailer. The effect of side wind is normally on the same order as that of road banking.

The MSD control allocation instruction 265 is sent to an MSD controller 230, which may comprise a central MSD control function (possibly integrated with the VMM function), or several separate MSD controllers. The MSD controller 230 then controls the physical actuators, which comprises a power steering arrangement, and optionally also braking and propulsion actuators.

The AD control function 272, the VMM function 260, and the MSD controller 230 normally operates on different time scales, where the AD control function plans and performs operations based on a time horizon of about 10 seconds or so and with an update rate on the order of a few Hertz, while the VMM function has a significantly faster update rate of about 10 ms. The MSD controller 230 normally has the fastest update rate, which allows it to perform accurate tracking and control of wheel slip and sideslip angle.

This way, the AD controller 270 may operate according to some assumed vehicle model 272 and generate control commands such as steering based on the vehicle behavior predicted by this model. The VMM 260 comprises the same model, or at least a model aligned with the model 272 used by the AD controller 270. The VMM function 260 uses its vehicle model to determine a desired vehicle behavior, and then performs MSD coordination such that the actual vehicle response closely mimics the desired vehicle behavior. This means that the AD controller 270 can be isolated from much of the complexity inherent in a modern heavy-duty vehicle, such as induced steering errors and potentially also other sources of error.

The VMM function 260 may of course end up in a scenario where it is no longer possible to mimic the behavior of the vehicle as predicted by the vehicle model 272 used in the AD controller 270, e.g., due to reduced road friction or other particularly challenging operating conditions, including various vehicle faults. If this happens, then the VMM function 260 may generate a fault condition signal 263, and the AD controller 270 may then enter into a fault handling mode of operation. This fault handling mode of operation may, e.g., comprise a reduction in vehicle velocity, or a full stop. The control systems 130, 140 disclosed herein may be arranged to compare a current vehicle state of the heavy-duty vehicle 100 to a threshold limit set in dependence of the desired vehicle behavior, and to trigger an action if the threshold is breached. For instance, the control system can be arranged to brake the vehicle 100 if the threshold limit is passed, by modification of the motion support device control allocation set points. The action may of course also comprise generation of a fault condition signal 263 sent to the AD controller 270, as indicated in FIG. 2. This fault signal could, e.g., prompt the AD controller to initiate a full stop by the vehicle, followed by a parking maneuver and a notification call to a service station.

In "Design of Variable Vehicle Handling Characteristics Using Four-Wheel Steer-by-Wire", IEEE transactions on control systems technology, vol. 24, no. 5, 2015, Russel and Gerdes proposes use of a vehicle model to determine desired vehicle behavior in response to human driver input. The approach taken here shows some resemblance with the current AD control strategy, although the disclosure focuses on an entirely different purpose. Here, the vehicle model is used to generate a desired vehicle behavior which mimics vehicle handling in a programmable condition, such as low friction conditions.

To summarize, there is disclosed herein a control system 130, 140 for autonomous drive of a heavy-duty vehicle 100. The control system comprises an AD controller 270 configured with a trajectory tracking function 271 arranged to track a desired vehicle trajectory. The trajectory tracking function may, e.g., be based on a look-ahead point along the desired vehicle trajectory, in a known manner.

The AD controller 270 also comprises a first vehicle model 272 arranged to model a response by the vehicle 100 to a requested steering angle. The trajectory tracking function 271 may track the desired vehicle trajectory by optimization of a cost function which is at least partly based on an output of the first vehicle model 272. For instance, a steering angle request for transmission to the VMM function can be selected from a range of allowable steering request values based on a predicted response by the vehicle and on the current state of the vehicle relative to the desired vehicle trajectory. Thus, as exemplified in FIG. 7, a steering angle request can be selected which is predicted to bring the vehicle in better agreement with the desired trajectory T, i.e., which reduces the lateral error y1 in a controlled manner, without introducing too much yaw motion or jerk.

According to an example, the first vehicle model 272 is configured to output an expected state of a towing vehicle unit 110 of the heavy-duty vehicle 100 in dependence of an applied steering wheel angle, where the expected state comprises any of a lateral position of the towing unit, a lateral deviation from a desired trajectory of a point of the towing unit, a yaw rate, a lateral acceleration, a lateral velocity, a longitudinal position, a longitudinal acceleration, and a longitudinal velocity of the towing vehicle unit 110.

According to another example, the first vehicle model 272 is configured to output an expected state of a towed vehicle unit 120 of the heavy-duty vehicle 100 in dependence of an applied steering wheel angle, where the expected state comprises any of an articulation angle of the towed unit, a lateral position of the towed unit, a lateral deviation from a desired trajectory of a point of the towed unit, a yaw rate, a lateral acceleration, a lateral velocity, a longitudinal position, a longitudinal acceleration, and a longitudinal velocity of the towed vehicle unit 110.

The AD controller 270 is arranged to generate a steering angle request 275 based on the desired vehicle trajectory and on the first vehicle model 272 and transmit this steering angle request to the VMM function 260. The steering angle request optionally corresponds to one or more virtual road wheel angles, which may then be used as input by the VMM function to the second vehicle model 261. The steering angle request may be a vector of steering angles for one or more steered virtual axles in case the vehicle comprises more than one steered axle. For instance, in case the vehicle comprises a dolly vehicle unit with a steered axle, then the control input for this steered axle can be comprised in the steering angle request. A steering angle request for one or more steered trailer axles can of course also be comprised in the steering angle request.

The term virtual road wheel angle is used herein to emphasize that the steering angle request from the AD controller does not necessarily result in a corresponding physical road wheel angle. In fact, there may in some cases not be any road wheel angle at all, for instance if the virtual road wheel angle is instead accommodated by differential braking. The term virtual axle is also used herein. The concept allows a model of the vehicle to comprise an axle when in fact the actual vehicle does not. Thus, the virtual axle may correspond to, e.g., a pair of physical axles, or an axle located in some other position that the virtual axle relative to some center position of the vehicle.

The VMM function 260 is arranged to receive the steering angle request 272 from the AD controller 270. As discussed above, the VMM function 260 comprises a second vehicle model 261 configured to be aligned with the first vehicle model 272, i.e., to agree with the first vehicle model in some manner. The VMM function 260 is arranged to obtain a desired vehicle behavior based on a response of the second vehicle model 261 to the steering angle request 275. The second vehicle model may, for instance, be configured to compensate for an induced steering error by the vehicle due to some vehicle internal or external effect. The second vehicle model may also be configured to compensate for differences in vehicle type and could also be configured to model time-varying vehicle properties such as tyre wear and the like. The first vehicle model 272 may, for instance, be a static vehicle model, such as a yaw gain model of the heavy-duty vehicle 100 or a dynamic vehicle model, such as a linear one-track model of the heavy-duty vehicle 100.

The VMM function 260 is arranged to determine motion support device control set points 265 in dependence of the desired vehicle behavior. For instance, the motion support devices can be configured to not cause longitudinal wheel slips that by absolute magnitude would be higher than a slip limit value. In other words, the VMM function, having received the steering angle request from the AD controller, and having access to the second vehicle model which is aligned with the first vehicle model, is in a position to infer what the AD controller desires from the vehicle. The VMM function then coordinates its available MSDs, i.e., determines set-points such as steering angle commands and torque commands, and sends these to the different MSDs. wherein the actual vehicle states are being measured or estimated then compared to the desired vehicle behavior for determining the motion support device control allocation set points. This way, a more consistent vehicle behavior to the steering angle requests can be obtained, since the VMM absorbs at least some of the disturbances generates by variation in vehicle dynamics and external factors acting on the vehicle to cause additional disturbances.

The actual vehicle states considered by the VMM function 260 may include any of lateral position of a point on a unit, yaw rate of a unit, lateral acceleration of a unit, lateral velocity of a unit, and body sideslip of a unit. These states may be directly measured by various sensors or estimated indirectly based on related states.

The VMM function 260 can be configured to determine a steering offset value, and to determine the motion support device control set points 265 in dependence of the steering offset value. The steering offset value can either be measured directly, or indirectly estimated based on related quantities. The steering offset value is used to, at least in part, adjust the steering angle request from the AD controller before it is transmitted to the power steering system of the vehicle.

Figure 3:
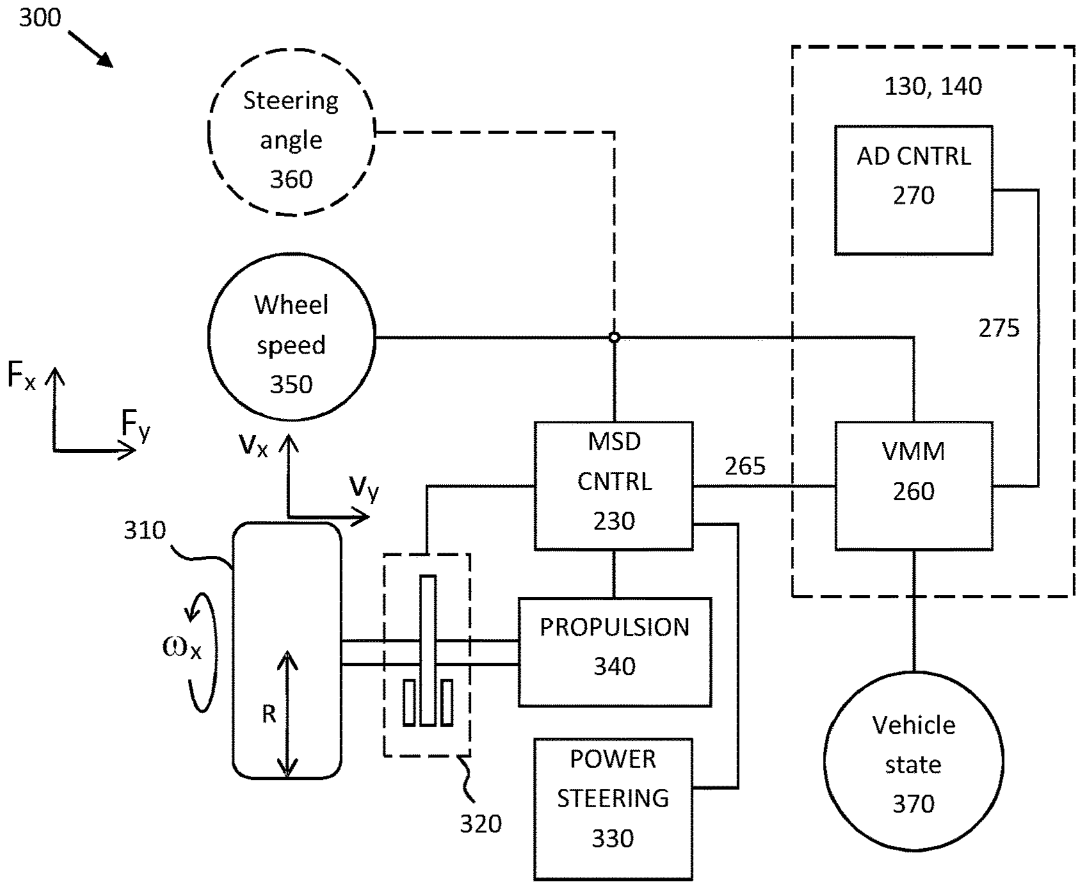
FIG. 3 shows an example motion support device control arrangement.

FIG. 3 schematically illustrates functionality 300 for controlling an example wheel 310 on the vehicle 100 by some example MSDs here comprising a friction brake 320 (such as a disc brake or a drum brake), a propulsion device 340 and a steering arrangement 330. The friction brake 320 and the propulsion device are examples of wheel torque generating devices, which can be controlled by one or more motion support device control units 230. The control is based on, e.g., measurement data obtained from a wheel speed sensor 350 and from other vehicle state sensors 370, such as radar sensors, lidar sensors, and also vision based sensors such as camera sensors and infra-red detectors. An MSD control unit 230 may be arranged to control one or more actuators. For instance, it is not uncommon that an MSD control unit 230 is arranged to control both wheels on an axle. Each MSD has a number of set-points which represent input data that control the behavior of the MSD. The VMM function 260 is arranged to coordinate the various MSDs to obtain a vehicle behavior in line with that expected by the AD controller 270.

The functionality 300 for instance comprises control of steering angle δ via the power steering arrangement 330. The MSD control unit 230 receives information related to the current steering angle, either directly from an optional steering angle sensor 360 or indirectly via a model of steering angle as function of steering angle control input generated by the MSD control unit 230.

The AD controller 270 plans driving operation with a time horizon of 10 seconds or so. This time frame corresponds to, e.g., the time it takes for the vehicle 100 to negotiate a curve or the like. The vehicle maneuvers, planned and executed by the AD controller, can be associated with acceleration profiles and curvature profiles which describe a desired target vehicle velocity in the vehicle forward direction and turning to be maintained for a given maneuver. The AD controller continuously requests the desired acceleration profiles $a_{req}$ and steering angles (or curvature profiles $c_{req}$) from the VMM function 260 which performs force allocation to meet the requests from the AD controller in a safe and robust manner, using the desired vehicle behavior generated by the vehicle model 261. The VMM function 260 optionally continuously feeds back capability information to the AD controller 270 detailing the current capability of the vehicle in terms of, e.g., forces, maximum velocities, and accelerations which can be generated. The VMM function 260 operates on a timescale of below one second or so.

The wheel 310 has a longitudinal velocity component $v_x$ and a lateral velocity component $v_y$. There is a longitudinal wheel force $F_x$ and a lateral wheel force $F_y$, and also a normal force $F_z$ acting on the wheel (not shown in FIG. 3). Unless explicitly stated otherwise, the wheel forces are defined in the coordinate system of the wheel, i.e., the longitudinal force is directed in the rolling plane of the wheel, while the lateral wheel force is directed normal to the rolling plane of the wheel. The wheel has a rotational velocity $\omega_x$, and a radius R.

Longitudinal wheel slip $\lambda_x$ may, in accordance with SAE J670 (SAE Vehicle Dynamics Standards Committee Jan. 24, 2008) be defined as $$\lambda_x = \frac{R\omega_x - v_x}{\max(|R\omega_x|, |v_x|)}$$

where R is an effective wheel radius in meters, $\omega_x$ is the angular velocity of the wheel, and $v_x$ is the longitudinal speed of the wheel (in the coordinate system of the wheel). Thus, $\lambda_x$ is bounded between −1 and 1 and quantifies how much the wheel is slipping with respect to the road surface. Wheel slip is, in essence, a speed difference measured between the wheel and the vehicle. Thus, the herein disclosed techniques can be adapted for use with any type of wheel slip definition. It is also appreciated that a wheel slip value is equivalent to a wheel speed value given a velocity of the wheel over the surface, in the coordinate system of the wheel.

The VMM 260 and optionally also the MSD control unit 230 optionally maintains information on $v_x$ (in the reference frame of the wheel), while a wheel speed sensor 240 or the like can be used to determine $\omega_x$ (the rotational velocity of the wheel).

In order for a wheel (or tyre) to produce a wheel force, slip must occur. For smaller slip values the relationship between slip and generated force are approximately linear, where the proportionality constant is often denoted as the slip stiffness of the tyre. A tyre 310 is subject to a longitudinal force $F_x$, a lateral force $F_y$, and a normal force $F_z$. The normal force $F_z$ is key to determining some important vehicle properties. For instance, the normal force to a large extent determines the achievable lateral tyre force $F_y$ by the wheel since, normally, $F_x \leq \mu F_z$, where μ is a friction coefficient associated with a road friction condition. The maximum available lateral force for a given lateral slip can be described by the so-called Magic Formula as described in "Tyre and vehicle dynamics", Elsevier Ltd. 2012, ISBN 978-0-08-097016-5, by Hans Pacejka.

Figure 4:
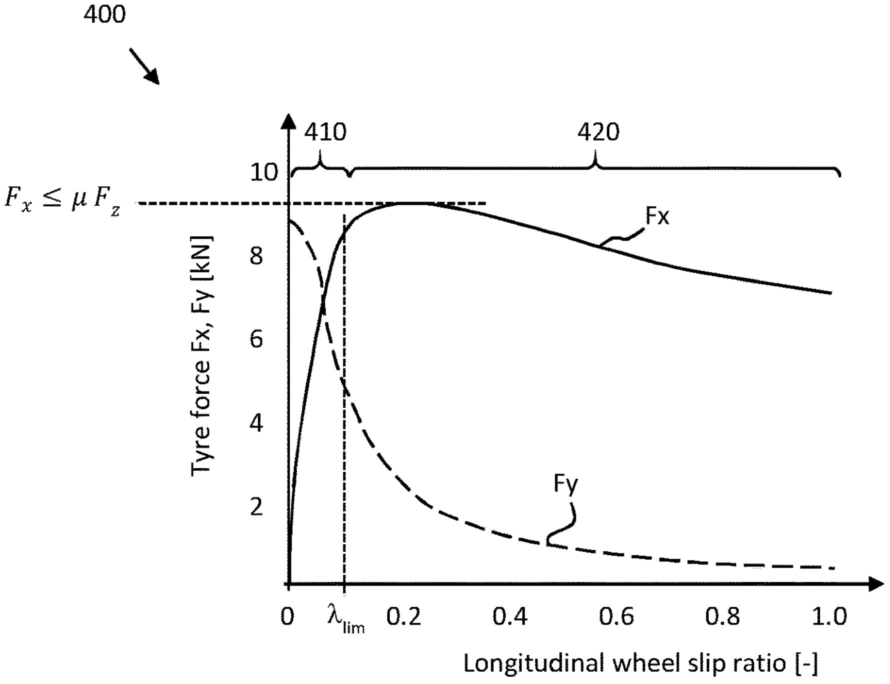
FIG. 4 is a graph showing example tyre forces as function of longitudinal wheel slip.

FIG. 4 is a graph showing an example 400 of achievable tyre force as function of longitudinal wheel slip. The longitudinal tyre force Fx shows an almost linearly increasing part 410 for small wheel slips, followed by a part 420 with more non-linear behaviour for larger wheel slips. The obtainable lateral tyre force Fy decreases rapidly even at relatively small longitudinal wheel slips. It is desirable to maintain vehicle operation in the linear region 410, where the obtainable longitudinal force in response to an applied brake command is easier to predict, and where enough lateral tyre force can be generated if needed. To ensure operation in this region, a wheel slip limit $\lambda_{lim}$ on the order of, e.g., 0.1, can be imposed on a given wheel. For larger wheel slips, e.g., exceeding 0.1, a more non-linear region 420 is seen. Control of a vehicle in this region may be difficult and is therefore often avoided. It may be interesting for traction in off-road conditions and the like where a larger slip limit for traction control might be preferred, but not for on-road operation.

The slip angle, α of a wheel 310 is defined as $$\alpha = \arctan\left(\frac{v_y}{|v_x|}\right)$$

Some of the techniques described herein rely on the realization that, for most vehicle manoeuvres and for most vehicle states, there is a slip angle α beyond which vehicle maneuvering capability deteriorates, i.e., additional slip angle increase will only lead to worse vehicle maneuverability "more is worse" and may also result in non-linear vehicle behavior. When the current sideslip angle of some wheel on the vehicle 100 approaches the limit value, it no longer makes sense to increase steering angle further, since the sideslip then becomes too large. As will be discussed below, a too large sideslip angle often results in loss of capability to generate longitudinal force. Also, at small longitudinal wheel slips, a too large sideslip angle may even imply a reduction in generated lateral force by a tyre. This means that the VMM function 260 may actually decrease the actual steering wheel angle in response to an increase in the steering angle request from the AD controller, since an increase in the steering angle set-point would just generate a reduced amount of steering by the vehicle 100. By keeping track of the current road conditions, and the state of the tyres on the vehicle 100, the VMM function 260 is able to adjust the MSD control allocation and the MSD set-points in order to obtain a more consistent response by the vehicle 100 to the steering requests issued from the AD controlled.

The type of tyre model 400 shown in FIG. 3 can be used by the VMM 260 to generate a desired tyre force at some wheel. Instead of requesting a torque corresponding to the desired tyre force, the VMM can translate the desired tyre force into an equivalent wheel slip (or, equivalently, a wheel speed relative to a speed over ground) and request this slip instead. The main advantage being that the MSD control device 230 will be able to deliver the requested torque with much higher bandwidth by maintaining operation at the desired wheel slip, using the vehicle speed $v_x$ and the wheel rotational velocity $\omega_x$, obtained, e.g., from the wheel speed sensor 350. The vehicle speed $v_x$ can be obtained from various vehicle sensors such as radar, lidar, and vision-based sensor in combination with a global positioning system (GPS) receiver and the like.

The control unit 130, 140 can be arranged to store a pre-determined inverse tyre model $f^{-1}$ in memory, e.g., as a look-up table. The inverse tyre model is arranged to be stored in the memory as a function of the current operating condition of the wheel 310. This means that the behavior of the inverse tyre model is adjusted in dependence of the operating condition of the vehicle, which means that a more accurate model is obtained compared to one which does not account for operating condition. The model which is stored in memory can be determined based on experiments and trials, or based on analytical derivation, or a combination of the two. For instance, the control unit can be configured to access a set of different models which are selected depending on the current operating conditions. One inverse tyre model can be tailored for high load driving, where normal forces are large, another inverse tyre model can be tailored for slippery road conditions where road friction is low, and so on. The selection of a model to use can be based on a pre-determined set of selection rules. The model stored in memory can also, at least partly, be a function of operating condition. Thus, the model may be configured to take, e.g., normal force or road friction as input parameters, thereby obtaining the inverse tyre model in dependence of a current operating condition of the wheel 310. It is appreciated that many aspects of the operating conditions can be approximated by default operating condition parameters, while other aspects of the operating conditions can be roughly classified into a smaller number of classes. Thus, obtaining the inverse tyre model in dependence of a current operating condition of the wheel 310 does not necessarily mean that a large number of different models need to be stored, or a complicated analytical function which is able to account for variation in operating condition with fine granularity. Rather, it may be enough with two or three different models which are selected depending on operating condition. For instance, one model to be used when the vehicle is heavily loaded and another model to be used otherwise. In all cases, the mapping between tyre force and wheel slip changes in some way in dependence of the operating condition, which improves the precision of the mapping.

The inverse tyre model may also be implemented at least partly as an adaptive model configured to automatically or at least semi-automatically adapt to the current operating conditions of the vehicle. This can be achieved by constantly monitoring the response of a given wheel in terms of wheel force generated in response to a given wheel slip request, and/or monitoring the response of the vehicle 100 in response to the wheel slip requests. The adaptive model can then be adjusted to more accurately model the wheel forces obtained in response to a given wheel slip request from a wheel.

Notably, by careful monitoring of wheel slip, non-linear behavior by one or more tyres can be avoided. Non-linear behavior by the vehicle is often difficult to model accurately. Thus, by keeping the vehicle within the linear regions of the tyre force curves, more consistent vehicle behavior can be obtained.

Inverse tyre models can be automatically configured from the remote server 190, e.g., as software updates, or manually by a technician performing vehicle routine servicing.

Figure 5:
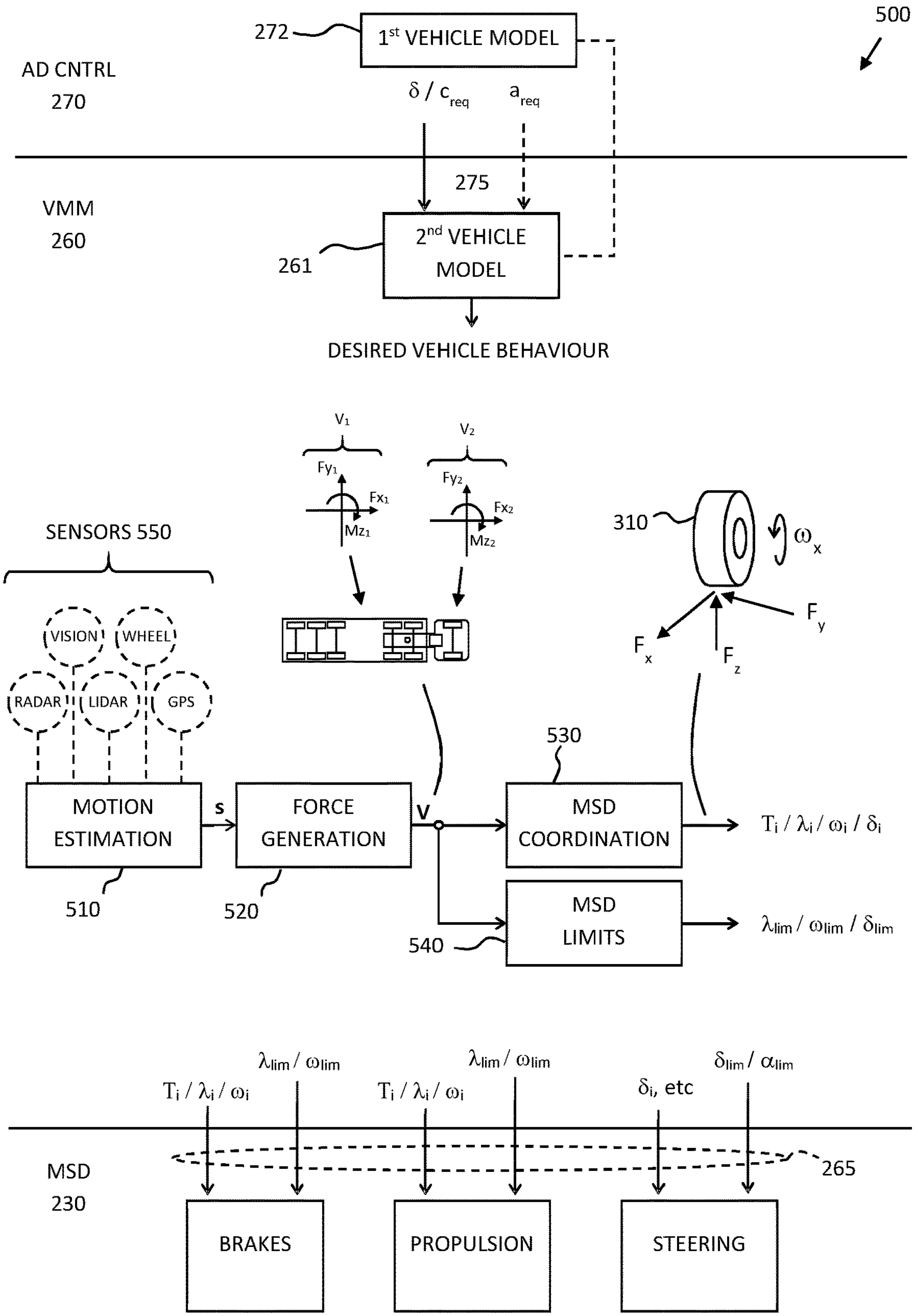
FIG. 5 illustrates an example vehicle control function architecture.

FIG. 5 illustrates an example vehicle control function architecture, where an AD controller 270 generates vehicle motion requests 275, which comprises a desired steering angle δ or an equivalent curvature to be followed by the vehicle, and which may optionally also comprise desired vehicle unit accelerations $a_{req}$ other types of vehicle motion requests, which together describe a desired motion by the vehicle along a desired path at a desired velocity profile. It is understood that the motion requests can be used as base for determining or predicting a required amount of longitudinal and lateral forces which needs to be generated in order to successfully complete a maneuver.

The VMM function 260 operates with a time horizon of about 1 second or so, and continuously transforms the acceleration profiles $a_{req}$ and curvature profiles $c_{req}$ from the AD controller 270 into control commands for controlling vehicle motion functions, actuated by the different MSDs of the vehicle 100 which report back capabilities to the VMM, which in turn are used as constraints in the vehicle control. The VMM function 260 performs vehicle state or motion estimation 510, i.e., the VMM function 260 continuously determines a vehicle state s comprising positions, speeds, accelerations, and articulation angles of the different units in the vehicle combination by monitoring operations using various sensors 550 arranged on the vehicle 100, often but not always in connection to the MSDs.

The result of the motion estimation 510, i.e., the estimated vehicle state s, is input to a force generation module 520 which determines the required global forces $V=[V_1, V_2]$ for the different vehicle units to cause the vehicle 100 to move according to the requested acceleration and curvature profiles $a_{req}$, $c_{req}$, and to behave according to the desired vehicle behavior. The required global force vector V is input to an MSD coordination function 530 which allocates wheel forces and coordinates other MSDs such as steering and suspension. The MSD coordination function outputs an MSD control allocation for the i:th wheel, which may comprise any of a torque $T_i$, a longitudinal wheel slip $\lambda_i$, a wheel rotational speed $\omega_i$, and/or a wheel steering angle $\delta_i$. The coordinated MSDs then together provide the desired lateral Fy and longitudinal Fx forces on the vehicle units, as well as the required moments Mz, to obtain the desired motion by the vehicle combination 100. Thus, the response which the AD controller 270 expects from the vehicle 100 based on the output of the first model 272 is also obtained in reality from the physical vehicle, since the VMM function performs MSD control allocation with an objective to obtain the desired behavior.

By determining vehicle unit motion using, e.g., global positioning systems, vision-based sensors, wheel speed sensors, radar sensors, steering angle sensors and/or lidar sensors, and translating this vehicle unit motion into a local coordinate system of a given wheel 310 (in terms of, e.g., longitudinal and lateral velocity components), it becomes possible to accurately estimate wheel slip in real time by comparing the vehicle unit motion in the wheel reference coordinate system to data obtained from the wheel speed sensor 350 arranged in connection to the wheel 310. A tyre model, which was discussed above in connection to FIG. 4, can be used to translate between a desired longitudinal tyre force $Fx_i$ for a given wheel i and an equivalent longitudinal wheel slip $\lambda_i$ for the wheel. Longitudinal wheel slip relates to a difference between wheel rotational velocity and speed over ground and will be discussed in more detail below. Wheel speed ω is a rotational speed of the wheel, given in units of, e.g., rotations per minute (rpm) or angular velocity in terms radians/second (rad/sec) or degrees/second (deg/sec). Herein, a tyre model is a model of wheel behavior which describes wheel force generated in longitudinal direction (in the rolling direction) and/or lateral direction (orthogonal to the longitudinal direction) as function of wheel slip, as discussed above. In "Tyre and vehicle dynamics", Elsevier Ltd. 2012, ISBN 978-0-08-097016-5, Hans Pacejka covers the fundamentals of tyre models. See, e.g., chapter 7 where the relationship between wheel slip and longitudinal force is discussed.

To summarize, according to some aspects of the present disclosure, the VMM function 260 manages both force generation and MSD coordination, i.e., it determines what forces that are required at the vehicle units in order to fulfil the requests from the TSM function 270, for instance to accelerate the vehicle according to a requested acceleration profile requested by TSM and/or to generate a certain curvature motion by the vehicle also requested by TSM. The forces may comprise e.g., yaw moments Mz, longitudinal forces Fx and lateral forces Fy, as well as different types of torques to be applied at different wheels. The forces are determined such as to generate the vehicle behavior which is expected by the AD controller in response to the control inputs generated by the AD controller 270.

The interface 265 between VMM and MSDs capable of delivering steering and optionally also torque to the vehicle's wheels has, traditionally, been focused on torque-based requests to each MSD from the VMM without any consideration towards wheel slip. However, this approach has significant performance limitations. In case a safety critical or excessive slip situation arises, then a relevant safety function (traction control, anti-lock brakes, etc.) operated on a separate control unit normally steps in and requests a torque override in order to bring the slip back into control. The problem with this approach is that since the primary control of the actuator and the slip control of the actuator are allocated to different electronic control units (ECUs), the latencies involved in the communication between them significantly limits the slip control performance. Moreover, the related actuator and slip assumptions made in the two ECUs that are used to achieve the actual slip control can be inconsistent and this in turn can lead to sub-optimal performance. Significant benefits can be achieved by instead using a wheel speed or wheel slip-based request on the interface 265 between VMM and the MSD controller or controllers 230, thereby shifting the difficult actuator speed control loop to the MSD controllers, which generally operate with a much shorter sample time compared to that of the VMM function. Such an architecture can provide much better disturbance rejection compared to a torque-based control interface and thus improves the predictability of the forces generated at the tyre road contact patch. This fast MSD control is particularly suitable for closely mimicking an expected vehicle behavior in response to the control requests issued by the AD controller 270.

The desired vehicle behavior can, for instance, be represented by any of a lateral position of a point on a vehicle unit 110, 120 of the heavy-duty vehicle 100, as shown in FIG. 7. The desired vehicle behavior can also be represented by a yaw rate of a vehicle unit 110, 120, a lateral acceleration of a vehicle unit 110, 120, a lateral velocity of a vehicle unit 110, 120, and a body sideslip of a vehicle unit 110, 120.

The control system 130, 140 may furthermore comprise a third vehicle model 262 configured for determining the motion support device control allocation set points for obtaining the desired vehicle behavior. This third vehicle model may be arranged to be periodically updated based on feedback from one or more sensors. The third vehicle model may also be configured to perform a feedforward control of the motion support devices based on the desired vehicle behavior.

According to aspects, the third vehicle model 262 comprises any of an estimate of vehicle motion caused by side wind, an estimate of vehicle motion caused by road banking, an estimate of vehicle motion caused by axle misalignment, an estimate of vehicle motion caused by a difference in tyre radius, a model of compliance in a steering system of the heavy-duty vehicle 100, and a model of suspension travel effect on a steering system of the heavy-duty vehicle 100.

Figure 8:
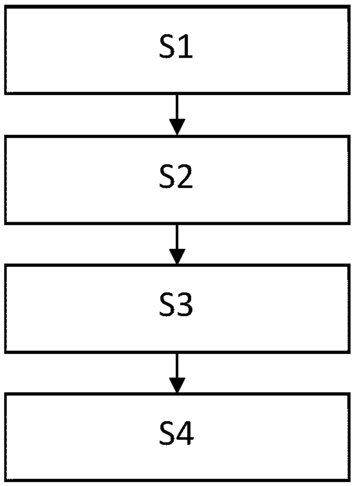
FIG. 8 is a flow chart illustrating methods.

FIG. 8 is a flow chart illustrating methods which summarize at least some of the discussions above. There is illustrated a computer-implemented method performed in a vehicle control unit 130, 140 for autonomously controlling motion of a heavy-duty vehicle 100. The method comprises configuring S1 a trajectory tracking function in an autonomous drive, AD, controller 270, wherein the trajectory tracking function 271 is arranged to track a desired vehicle trajectory, configuring S2 a first vehicle model 272 arranged to model a response by the vehicle 100 to a requested steering angle, generating S3 a steering angle request 275 by the AD controller 270 based on the desired vehicle trajectory and on the first vehicle model 272, and configuring S4 a vehicle motion management, VMM, function 260 to receive the steering angle request 272 from the AD controller 270, where the VMM function 260 comprises a second vehicle model 261 configured to be aligned with the first vehicle model 272, where the VMM function 260 is arranged to obtain a desired vehicle behavior based on a response of the second vehicle model 261 to the steering angle request 275, where the VMM function 260 is arranged to determine motion support device control set points 265 in dependence of the desired vehicle behavior.

Figure 9:
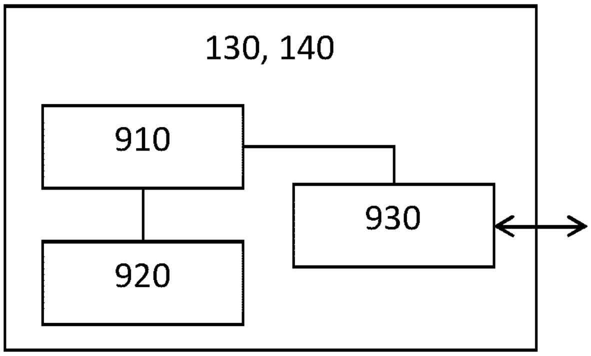
FIG. 9 schematically illustrates a control unit.

FIG. 9 schematically illustrates, in terms of a number of functional units, the components of a control unit such as any of the VCUs 130, 140. The control unit may implement one or more of the above discussed functions of the AD controller 270, VMM 260 and/or the MSD control function 230, according to embodiments of the discussions herein. The control unit is configured to execute at least some of the functions discussed above for control of a heavy-duty vehicle 100. Processing circuitry 910 is provided using any combination of one or more of a suitable central processing unit CPU, multiprocessor, microcontroller, digital signal processor DSP, etc., capable of executing software instructions stored in a computer program product, e.g., in the form of a storage medium 920. The processing circuitry 910 may further be provided as at least one application specific integrated circuit ASIC, or field programmable gate array FPGA.

Particularly, the processing circuitry 910 is configured to cause a control unit to perform a set of operations, or steps, such as the methods discussed in connection to FIG. 8. For example, the storage medium 920 may store the set of operations, and the processing circuitry 910 may be configured to retrieve the set of operations from the storage medium 920 to cause the control unit 130, 140 to perform the set of operations. The set of operations may be provided as a set of executable instructions. Thus, the processing circuitry 910 is thereby arranged to execute methods as herein disclosed.

For instance, the processing circuitry may realize a control unit 130, 140 for vehicle motion management (VMM) 260 of a heavy-duty vehicle 100, wherein the control unit 130, 140 is arranged to implement a VMM function 260. The control unit comprises processing circuitry configured to receive a steering angle request 272 from an AD controller 270, where the VMM function 260 comprises a second vehicle model 261 configured to be aligned with a first vehicle model 272 of the AD controller 270, where the VMM function 260 is arranged to obtain a desired vehicle behavior based on a response of the second vehicle model 261 to the steering angle request 275, where the VMM function 260 is arranged to determine motion support device control set points 265 in dependence of the desired vehicle behavior.

The storage medium 920 may also comprise persistent storage, which, for example, can be any single one or combination of magnetic memory, optical memory, solid state memory or even remotely mounted memory.

The control unit 130, 140 may further comprise an interface 930 for communications with at least one external device. As such the interface 930 may comprise one or more transmitters and receivers, comprising analogue and digital components and a suitable number of ports for wireline or wireless communication.

The processing circuitry 910 controls the general operation of the control unit 130, 140, e.g., by sending data and control signals to the interface 930 and the storage medium 920, by receiving data and reports from the interface 930, and by retrieving data and instructions from the storage medium 920. Other components, as well as the related functionality, of the control node are omitted in order not to obscure the concepts presented herein.

Figure 10:
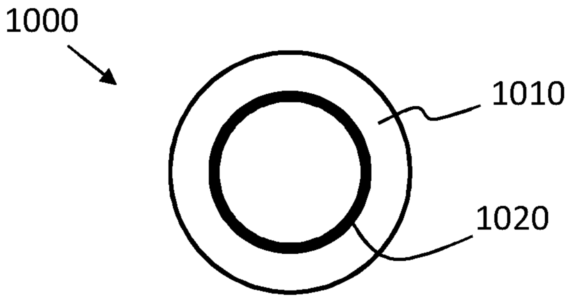
FIG. 10 shows an example computer program product.

FIG. 10 illustrates a computer readable medium 1010 carrying a computer program comprising program code means 1020 for performing the methods illustrated in FIG. 8, when said program product is run on a computer. The computer readable medium and the code means may together form a computer program product 1000.

The invention claimed is:

1. A control system for autonomous drive of a heavy-duty vehicle, comprising an autonomous drive ("AD") controller configured with a trajectory tracking function arranged to track a desired vehicle trajectory, and a first vehicle model arranged to model a response by the vehicle to a requested steering angle, where the AD controller is arranged to generate a steering angle request based on the desired vehicle trajectory and on the first vehicle model, the control system further comprising a vehicle motion management ("VMM") function arranged to receive the steering angle request from the AD controller, where the VMM function comprises a second vehicle model configured to be aligned with the first vehicle model by a continuous or periodic exchange of a pre-determined number of model parameter values between the first and second vehicle models, wherein the model parameter values correspond to at least one of a vehicle unit mass, a road friction level, or an axle load, where the VMM function is arranged to obtain a desired vehicle behavior based on a response of the second vehicle model to the steering angle request, where the VMM function is arranged to determine motion support device control set-points in dependence of the desired vehicle behavior.

2. The control system according to claim 1, wherein the trajectory tracking function is arranged to track the desired vehicle trajectory by optimization of a cost function which is at least partly based on an output of the first vehicle model.

3. The control system according to claim 1, wherein the trajectory tracking function is arranged to determine the steering angle request based on the first vehicle model.

4. The control system according to claim 1, wherein the steering angle request corresponds to one or more virtual road wheel angles.

5. The control system according to claim 1, wherein the first vehicle model is a static vehicle model, such as a yaw gain model of the heavy-duty vehicle or a dynamic vehicle model, such as a linear one-track model of the heavy-duty vehicle.

6. The control system according to claim 1, wherein the first vehicle model is configured to output an expected state of a towing vehicle unit of the heavy-duty vehicle in dependence of an applied steering wheel angle, where the expected state comprises any of a lateral position of the towing unit, a lateral deviation from a desired trajectory of a point of the towing unit, a yaw rate, a lateral acceleration, a lateral velocity, a longitudinal position, a longitudinal acceleration, and a longitudinal velocity of the towing vehicle unit.

7. The control system according to claim 1, wherein the first vehicle model is configured to output an expected state of a towed vehicle unit of the heavy-duty vehicle in dependence of an applied steering wheel angle, where the expected state comprises any of an articulation angle of the towed unit, a lateral position of the towed unit, a lateral deviation from a desired trajectory of a point of the towed unit, a yaw rate, a lateral acceleration, a lateral velocity, a longitudinal position, a longitudinal acceleration, and a longitudinal velocity of the towed vehicle unit.

8. The control system according to claim 1, wherein the steering angle request is a vector of steering angles for one or more steered virtual axles.

9. The control system according to claim 1, wherein the desired vehicle behavior is represented by any of a lateral position of a point on a vehicle unit of the heavy-duty vehicle, a yaw rate of a vehicle unit, a lateral acceleration of a vehicle unit, a lateral velocity of a vehicle unit, and a body sideslip of a vehicle unit.

10. The control system according to claim 1, wherein the second vehicle model is configured to be aligned with the first vehicle model by exchange of a pre-determined number of model parameter values.

11. The control system according to claim 10, wherein the model parameter values correspond to any of a vehicle unit mass, a vehicle unit yaw inertia, a tire stiffness, a road friction level, a vehicle longitudinal velocity, an axle load, a vehicle unit wheelbase, a vehicle unit coupling position, and a vehicle type.

12. The control system according to claim 1, wherein the second vehicle model is configured to be aligned with the first vehicle model by having one or more corresponding or identical states.

13. The control system according to claim 1, wherein the second vehicle model is a static vehicle model, such as a yaw gain model or a dynamic vehicle model.

14. The control system according to claim 1, wherein the VMM function is configured to determine a steering offset value, and to determine the motion support device control set points in dependence of the steering offset value.

15. The control system according to claim 1, comprising a third vehicle model configured for determining the motion support device control allocation set points based on the desired vehicle behavior.

16. The control system according to claim 15, wherein the third vehicle model comprises any of an estimate of vehicle motion caused by side wind, an estimate of vehicle motion caused by road banking, an estimate of vehicle motion caused by axle misalignment, an estimate of vehicle motion caused by a difference in tire radius, a model of compliance in a steering system of the heavy-duty vehicle, and a model of suspension travel effect on a steering system of the heavy-duty vehicle.

17. The control system according to claim 1, arranged to compare a current vehicle state of the heavy-duty vehicle to a threshold limit set in dependence of the desired vehicle behavior, and to trigger an action if the threshold is breached.

18. The control system according to claim 17, wherein the control system is arranged to brake the vehicle if the threshold limit is passed, by modification of the motion support device control allocation set points.

19. The control system according to claim 17, wherein the action comprises generation of a fault condition signal sent to the AD controller.

20. A control unit for vehicle motion management ("VMM") of a heavy-duty vehicle, wherein the control unit is arranged to implement a vehicle motion management VMM function, the control unit comprising processing circuitry configured to receive a steering angle request from an AD controller, where the VMM function comprises a second vehicle model configured to be aligned with a first vehicle model of the AD controller by a continuous or periodic exchange of a pre-determined number of model parameter values between the first and second vehicle models, wherein the model parameter values correspond to at least one of a vehicle unit mass, a road friction level, or an axle load, where the VMM function is arranged to obtain a desired vehicle behavior based on a response of the second vehicle model to the steering angle request, where the VMM function is arranged to determine motion support device control set points in dependence of the desired vehicle behavior.

21. A computer-implemented method performed in a vehicle control unit for autonomously controlling motion of a heavy-duty vehicle, the method comprising configuring a trajectory tracking function in an autonomous drive ("AD") controller, wherein the trajectory tracking function is arranged to track a desired vehicle trajectory, configuring a first vehicle model arranged to model a response by the vehicle to a requested steering angle, generating a steering angle request by the AD controller based on the desired vehicle trajectory and on the first vehicle model, and configuring a vehicle motion management ("VMM") function to receive the steering angle request from the AD controller, where the VMM function comprises a second vehicle model configured to be aligned with the first vehicle model by a continuous or periodic exchange of a pre-determined number of model parameter values between the first and second vehicle models. wherein the model parameter values correspond to at least one of a vehicle unit mass, a road friction level, or an axle load, where the VMM function is arranged to obtain a desired vehicle behavior based on a response of the second vehicle model to the steering angle request, where the VMM function is arranged to determine motion support device control set points in dependence of the desired vehicle behavior.

* * * * *